United States Patent
Miyazaki et al.

(10) Patent No.: US 10,325,851 B2
(45) Date of Patent: Jun. 18, 2019

(54) GRAPHENE WIRING STRUCTURE AND SEMICONDUCTOR DEVICE USING THE SAME

(71) Applicant: Kabushiki Kaisha Toshiba, Minato-ku (JP)

(72) Inventors: Hisao Miyazaki, Yokohama (JP); Tadashi Sakai, Yokohama (JP); Yasutaka Nishida, Tama (JP); Takashi Yoshida, Kashiwa (JP); Yuichi Yamazaki, Inagi (JP); Masayuki Katagiri, Tsukuba (JP); Naoshi Sakuma, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/691,257

(22) Filed: Aug. 30, 2017

(65) Prior Publication Data

US 2018/0277487 A1    Sep. 27, 2018

(30) Foreign Application Priority Data

Mar. 22, 2017   (JP) ................. 2017-056529

(51) Int. Cl.
  *H01L 21/768*  (2006.01)
  *H01L 23/522*  (2006.01)
  (Continued)

(52) U.S. Cl.
  CPC .. *H01L 23/53276* (2013.01); *H01L 21/32055* (2013.01); *H01L 21/32135* (2013.01); *H01L 21/32139* (2013.01); *H01L 21/76877* (2013.01); *H01L 21/76892* (2013.01); *H01L 23/5226* (2013.01); *H01L 23/5329* (2013.01); *H01L 23/53271* (2013.01); *H01L 27/1157* (2013.01);
  (Continued)

(58) Field of Classification Search
  None
  See application file for complete search history.

(56) References Cited

U.S. PATENT DOCUMENTS 4,996,123 A    2/1991   Nomura et al.
8,476,739 B2   7/2013   Okai et al.
(Continued)

FOREIGN PATENT DOCUMENTS

EP    1 065 553 A1    1/2001
JP    63-146031       6/1988
(Continued)

OTHER PUBLICATIONS

Dutta et al. "Edge reconstruction induces magnetic and metallic behavior in zigzag graphene nanoribbons" Carbon, vol. 48, 2010, pp. 4409-4413 (pp. 1-12).*

(Continued)

*Primary Examiner* — Telly D Green
(74) *Attorney, Agent, or Firm* — Oblon, McClelland, Maier & Neustadt, L.L.P.

(57) ABSTRACT

A graphene wiring structure of an embodiment has: an amorphous or polycrystalline insulating film; and a multilayer graphene on the insulating film. The multilayer graphene including a plurality of graphene crystals having a zigzag direction is oriented at 17 degrees or less with respect to an electric conduction direction on the insulating film.

20 Claims, 17 Drawing Sheets

(51) Int. Cl.
*H01L 23/532* (2006.01)
*H01L 21/3205* (2006.01)
*H01L 21/3213* (2006.01)
*H01L 27/1157* (2017.01)
*H01L 27/11524* (2017.01)
*H01L 27/11556* (2017.01)
*H01L 27/11582* (2017.01)

(52) U.S. Cl.
CPC ... *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 8,697,230 | B2 | 4/2014 | Ago et al. |
| 9,284,640 | B2* | 3/2016 | Kula ................. C25D 5/48 |
| 9,362,514 | B2 | 6/2016 | Udaka et al. |
| 2010/0247801 | A1 | 9/2010 | Zenasni |
| 2012/0088039 | A1* | 4/2012 | Yu ..................... B82Y 30/00 427/596 |
| 2012/0175594 | A1* | 7/2012 | Chen ................ H01L 29/4908 257/29 |
| 2013/0048339 | A1 | 2/2013 | Tour et al. |
| 2013/0095083 | A1* | 4/2013 | Oezyilmaz ......... A61L 27/3834 424/93.7 |
| 2014/0080291 | A1 | 3/2014 | Nozawa et al. |
| 2015/0064098 | A1* | 3/2015 | Grobert ............. C01B 31/0461 423/448 |
| 2015/0259210 | A1* | 9/2015 | Yamazaki ......... H01L 23/53276 428/402 |
| 2015/0292110 | A1* | 10/2015 | Wang ..................... C23C 16/26 117/103 |
| 2016/0025693 | A1 | 1/2016 | Lee et al. |

FOREIGN PATENT DOCUMENTS

| | | |
|---|---|---|
| JP | 6-90510 | 11/1994 |
| JP | 3418353 | 6/2003 |
| JP | 2005-89235 | 4/2005 |
| JP | 2010-153793 | 7/2010 |
| JP | 2010-229022 | 10/2010 |
| JP | 2013-542546 | 11/2013 |
| JP | 2014-55087 | 3/2014 |
| JP | 5641484 | 12/2014 |
| JP | 2015-176876 | 10/2015 |
| JP | 5790077 | 10/2015 |

OTHER PUBLICATIONS

Nonfinal Rejection for U.S. Appl. No. 14/628,607, filed Nov. 15, 2017.*
Neubeck et al. "Direct determination of the crystallographic orientation of graphene edges by atomic resolution imaging", Aug. 4, 2010, American Institute of Physics, Applied Physics Letter, 97, pp. 1-3. (Year: 2010).*
Hiroki Ago, et al. "Lattice-Oriented Catalytic Growth of Graphene Nanoribbons on Heteroepitaxial Nickel Films", ACS Nano, vol. 7, No. 12, 2013, 9 pages.
Dacheng Wei, et al. "Critical Crystal Growth of Graphene on Dielectric Substrates at Low Temperature for Electronic Devices", Angewandte Chemie International Edition, 52, 2013, 6 pages.
Dirk J. Broer, et al. "Photo-Induced Diffusion in Polymerizing Chiral-Nematic Media", Advanced Materials, 11, 1999, 6 pages.
Sukang Bae, et al. "Roll-to-roll production of 30-inch graphene films for transparent electrodes", Nature Nanotechnology, vol. 5, 2010, 5 pages.
L.G. Cancado, et al. "Measuring the degree of stacking order in graphite by Raman spectroscopy", Carbon, 46, 2008, 5 pages.

* cited by examiner

GRAPHENE WIRING STRUCTURE AND SEMICONDUCTOR DEVICE USING THE SAME

CROSS-REFERENCE TO RELATED APPLICATION

This application is based upon and claims the benefit of priority from Japanese Patent Application No. 2017-056529, filed on Mar. 22, 2017; the entire contents of which are incorporated herein by reference.

FIELD

Embodiments described herein relate to a graphene wiring structure, a semiconductor device, a method for manufacturing a graphene wiring structure, and a method for manufacturing a wiring structure.

BACKGROUND

A graphene is a two-dimensional nanomaterial formed of carbon atoms. An edge of the two-dimensional material is a topological peculiar part, and physical properties thereof change according to a structure thereof. A graphene has two types of edge structure called zigzag (ZZ) and armchair (AC). It has been theoretically and experimentally reported that due to these differences, a change in physical properties such as electrical characteristics (generation of a band gap in an ultrafine graphene formed of AC edges) or magnetic properties (transition between antiferromagnetism and ferromagnetism in an ultrafine graphene formed of ZZ edges) occurs.

In order to apply such physical properties to an actual device, a graphene processing technique to control an edge structure at an atomic level is necessary, and it is required to realize this technique on a large area substrate of 300 mm or the like for industrial applications. A large area graphene growth technique already exists. However, a metal thin film serving as a substrate is polycrystalline, and therefore a growing graphene also becomes polycrystalline inevitably. This makes processing in a specific direction difficult. Therefore, like other materials, a graphene essentially needs a single crystal/large area growth technique for device application. The inventors have found a single crystal/large area graphene growth method.

DETAILED DESCRIPTION

Figure 1:
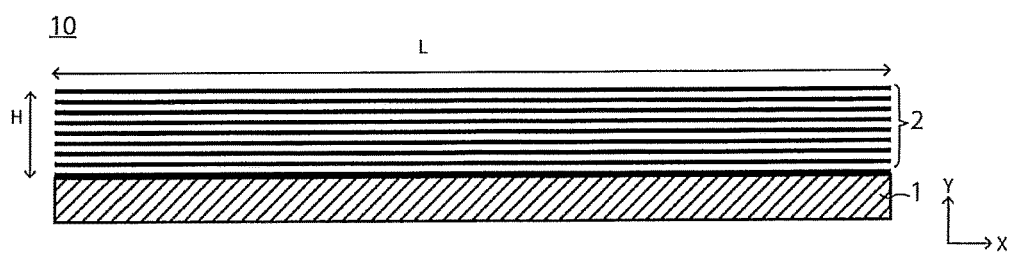
FIG. 1 is a schematic diagram of a graphene wiring structure according to an embodiment.

A graphene wiring structure of an embodiment has: an amorphous or polycrystalline insulating film; and a multilayer graphene on the insulating film. The multilayer graphene including a plurality of graphene crystals having a zigzag direction is oriented at 17 degrees or less with respect to an electric conduction direction on the insulating film.

First Embodiment

Hereinafter, embodiments of the present disclosure will be described with reference to the drawings. Components with the same reference numerals indicate similar components. Note that the drawings are schematic or conceptual, and a relationship between a thickness and a width of each portion, a ratio coefficient of a size between portions, and the like are not necessarily the same as actual ones. Even in a case of illustrating the same portion, the drawings may illustrate the same portion such that dimensions and ratio coefficients are different from one another. Arrows in the drawings indicate an orientation direction of a crystal, a polarization direction, and the like.

A graphene wiring structure according to a first embodiment includes an amorphous or polycrystalline insulating film, and a multilayer graphene including a plurality of graphene crystals having a zigzag direction oriented at 17 degrees or less with respect to an electric conduction direction on the insulating film.

FIG. 1 illustrates a schematic cross-sectional diagram of the graphene wiring structure according to the first embodiment.

A graphene wiring structure 10 of FIG. 1 includes a multilayer graphene 2 on an insulating film 1. The electric conduction direction which is a longitudinal direction of the multilayer graphene 2 is defined as an X direction, and a wiring height direction which is a lamination direction of graphene sheets constituting the multilayer graphene 2 is defined as a Y direction. A Z direction is not illustrated in FIG. 1, but is a direction perpendicular to an X-Y plane. A wiring width direction which is a short direction of the multilayer graphene 2 is defined as a Z direction.

The insulating film 1 is an insulating film supporting the multilayer graphene 2. The multilayer graphene 2 is present on the insulating film 1. The multilayer graphene 2 is preferably present right above the insulating film 1. In addition, the multilayer graphene 2 is preferably in direct contact with the insulating film 1. The insulating film 1 is not a single crystal film, but an amorphous or polycrystalline film.

The insulating film 1 is not particularly limited as long as being insulating, but is preferably a film containing at least one selected from the group consisting of $SiO_2$, $Al_2O_3$, $TiO_2$, and the like. Furthermore, the insulating film 1 is more preferably any one selected from the group consisting of a $SiO_2$ film, an $Al_2O_3$ film, a $TiO_2$ film, and the like. The thickness of the insulating film 1 is, for example, 0.01 μm or more and 1000 μm or less.

X-ray diffraction analysis confirms whether the insulating film 1 is an amorphous or polycrystalline film. If a peak derived from a crystal period does not appear in an X-ray diffraction spectrum, the insulating film 1 is amorphous. If a peak derived from a crystal period appears in an X-ray diffraction spectrum, the insulating film 1 is polycrystalline.

The multilayer graphene 2 includes a plurality of graphene crystals having a zigzag direction oriented at 17 degrees or less with respect to an electric conduction direction. The multilayer graphene 2 has a structure having a plurality of planar graphene sheets laminated. The planar graphene sheets include a plurality of graphene crystals having a zigzag direction oriented at 17 degrees or less with respect to an electric conduction direction. Each of the planar graphene sheets may be a single atomic layer formed of carbon atoms or a single atomic layer in which a part of carbon atoms is bonded to an oxygen atom, a nitrogen atom, or the like.

The lamination number of planar graphene sheets is not particularly limited, but is preferably 10 or more and 100 or less, for example. A distance of the multilayer graphene 2 in a lamination direction is a height of the multilayer graphene 2. A height H of the multilayer graphene 2 is, for example, 3 nm or more and 35 nm or less. In a case where an interlayer substance is present between layers of the multilayer graphene 2, an interlayer distance of the multilayer graphene 2 is increased from 0.335 nm to, for example, 0.5 nm or more and 1 nm or less. Therefore, in a case where an interlayer substance is contained between the layers, the height H of the multilayer graphene 2, is 5 nm or more and 100 nm or less. The interlayer substance is preferably a substance to contribute to lowering resistance of the multilayer graphene 2, and for example, is a metal halide such as iron chloride or molybdenum chloride, or a halogen without being particularly limited.

A width W of the multilayer graphene 2 is a short side in a direction parallel to a plane of the insulating film 1 of the multilayer graphene 2. The width W of the multilayer graphene 2 is preferably 3 nm or more and 10 nm or less.

A length L of the multilayer graphene 2 is a long side in a direction parallel to a plane of the insulating film 1 of the multilayer graphene 2. The length L of the multilayer graphene 2 is not limited, but is 10 μm or more.

A ratio (W/H) between the height H and the width W of the multilayer graphene 2 is preferably 0.1 or more and 10 or less. A too small value of the ratio makes electric resistance high, and is not preferable. A too large value of the ratio causes mechanical destruction easily, and is not preferable.

A graphene has two types of edges of a zigzag edge and an armchair edge. When there is a zigzag edge in a length direction of wiring, that is, when an electric conduction direction is a zigzag direction, the resistance is low. However, when there is an armchair edge in the length direction of the wiring, that is, when the electric conduction direction is the armchair direction, a graphene becomes semiconductive. When the zigzag direction faces the electric conduction direction, the wiring is preferable because of its low resistance. In the embodiment, the length direction of the multilayer graphene 2, which is the longitudinal direction of the multilayer graphene 2 is defined as an electric conduction direction of the graphene wiring structure 10.

Crystallinity of a graphene is influenced by crystallinity of a supporting base material thereof. Therefore, if the supporting base material is formed of single crystals, the crystal orientation of the graphene easily becomes uniform. However, wiring using a graphene is expected to be used for a semiconductor device, and it is not easy to form a single crystal film having a wafer size of 12 inches or the like. When a monocrystalline insulating film is formed in consideration of wiring resistance of a graphene, very large cost is required, and furthermore, the yield is low. Meanwhile, when a graphene is provided on the amorphous or polycrystalline insulating film 1, the crystalline orientation of the graphene becomes random due to an influence of crystallinity of the insulating film. Therefore, resistance of the graphene increases as it is. However, in the embodiment, it is possible to control the crystal orientation of a graphene provided on the amorphous or polycrystalline insulating film 1. This makes it possible to stably manufacture low resistance wiring with a polycrystalline graphene.

Figure 2:
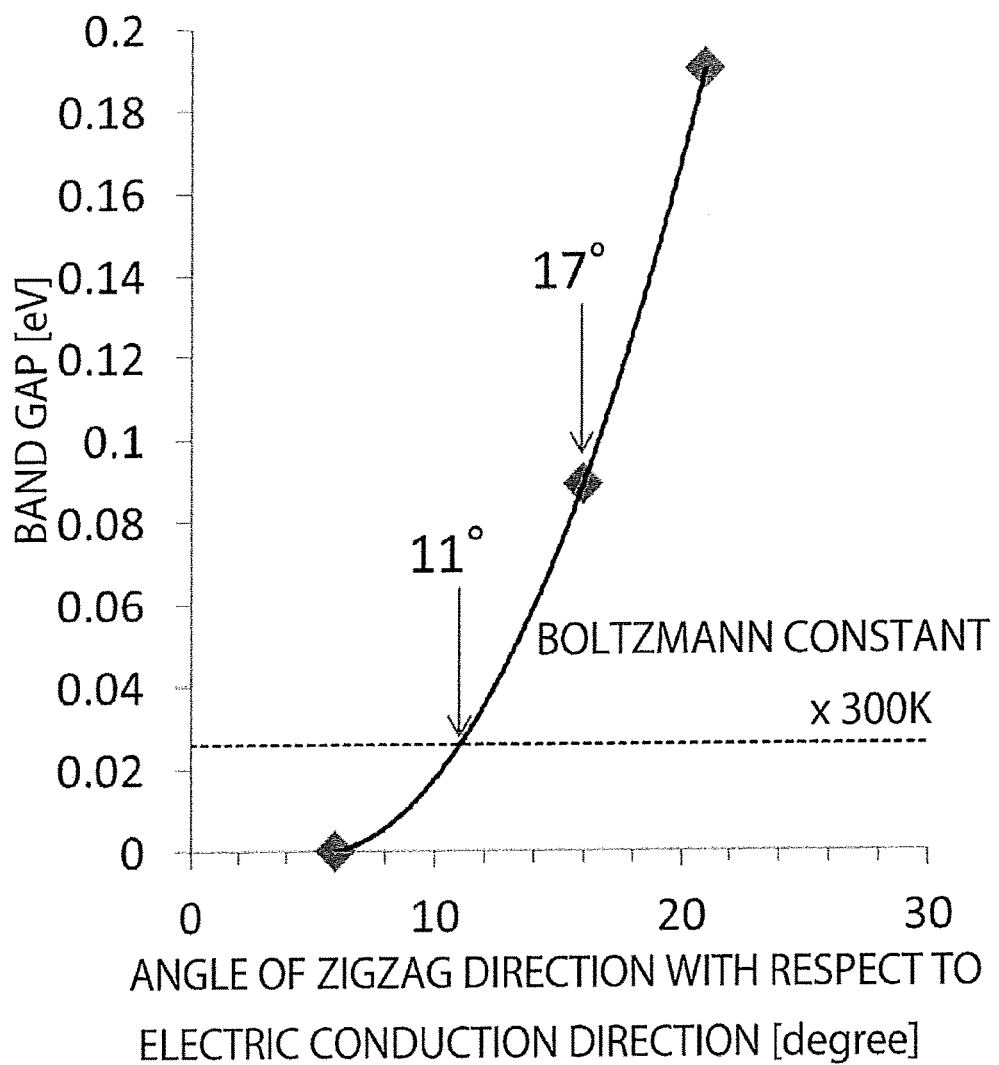
FIG. 2 is a graph illustrating a relationship between an angle of a zigzag direction of graphene crystals with respect to an electric conduction direction according to an embodiment and a band gap.

The graph in FIG. 2 illustrates a relationship between an angle of a zigzag direction of graphene crystals having a width of about 1 nm with respect to an electric conduction direction and a band gap. As a rough trend, the band gap of a graphene is inversely proportional to the width of graphene crystals. Even if a graphene is semiconductive, that is, even if the graphene has a band gap, when the band gap can be exceeded by heat of about room temperature, the graphene can be used as low resistance wiring. When the zigzag direction deviates from the electric conduction direction, the band gap increases. However, a somewhat small band gap can be exceeded by thermal energy. Therefore, even if the zigzag direction does not coincide with the electric conduction direction, the multilayer graphene 2 becomes a low-resistance conductive material. As a result of first principle calculation, it has been indicated that at a normal temperature, the resistance is low when an angle of the zigzag direction of a graphene with respect to the electric conduction direction is 17 degrees or less. Therefore, in the embodiment, the multilayer graphene 2 preferably includes a plurality of graphene crystals having a zigzag direction oriented at 17 degrees or less with respect to an electric conduction direction. The multilayer graphene 2 is more preferably formed of a plurality of graphene crystals having the zigzag direction oriented at 17 degrees or less with respect to the electric conduction direction. Hereinafter, when the angle of the zigzag direction of graphene crystals with respect to the electric conduction direction is 17 degrees or less, it is assumed that "the crystal orientation of graphene crystals is uniform". Incidentally, when including a bent wiring structure, the graphene wiring structure 10 includes many regions where the angle of the zigzag direction of graphene crystals largely deviates from the range of 17 degrees or less, and the resistance of the wiring is increased. Therefore, the graphene wiring structure 10 according to the first embodiment is preferably applied to a linear portion of the wiring, and preferably includes no bending. That is, the multilayer graphene 2 is preferably a laminate of planar graphene sheets, and more preferably a laminate of a plurality of strip-shaped graphene sheets having no bent portion such as curved geometry.

If it is possible to realize low resistance wiring only when the angle of the zigzag direction of graphene crystals with respect to the electric conduction direction is within a very narrow range, it is not easy to manufacture low resistance graphene wiring by making the crystal orientation uniform. However, in the embodiment, when the angle of the zigzag direction of graphene crystals with respect to the electric conduction direction is 17 degrees or less, the graphene crystals have particularly low resistance, and therefore it is possible to realize low resistance wiring even with polycrystalline graphene. The smaller the angle of the zigzag direction of graphene crystals with respect to the electric conduction direction is, the lower the resistance of the wiring becomes. Therefore, the angle of the zigzag direction of graphene crystals with respect to the electric conduction direction is more preferably 13 degrees or less, and still more preferably 11 degrees or less. In polycrystalline graphene, it is difficult to make the angle of the zigzag direction of graphene crystals with respect to the electric conduction direction perfectly uniform, and therefore the angle of the zigzag direction of graphene crystals with respect to the electric conduction direction is only required to be 1 degree or more. The angle of the zigzag direction of graphene crystals with respect to the electric conduction direction is preferably 0 degrees or more and 17 degrees or less, more preferably 1 degree or more and 17 degrees or less, still more preferably 1 degree or more and 13 degrees or less, and further still more preferably 1 degree or more and 11 degrees or less.

In a case of a polycrystalline graphene, the graphene inevitably contains a grain boundary. If there is a grain boundary, a cyclic structure such as a five-membered ring or a seven-membered ring is present in addition to a six-membered ring in a plurality of graphene crystals of the multilayer graphene 2. The angle of the zigzag direction of a graphene with respect to the electric conduction direction does not include this grain boundary.

The zigzag direction of a graphene with respect to the electric conduction direction can be measured by electron backscatter diffraction (EBSD) or with a scanning tunneling microscope (STM). Scanning is performed from the center in a width direction of a planar graphene sheet on the outermost surface of the multilayer graphene 2 along the electric conduction direction which is a wiring length direction. A region to be scanned includes the center of ten divided regions obtained by dividing the multilayer graphene 2 into ten parts in the wiring length direction. A region where 10 or more 6-membered ring structures are continuously and regularly confirmed is defined as a graphene crystal other than a grain boundary. The zigzag direction of graphene crystals with respect to the electric conduction direction is determined by measuring an orientation of a 6-membered ring structure in the region where 10 or more 6-membered ring structures are continuously and regularly confirmed.

FIGS. 3A, 3B, 3C, and 3D each illustrate a schematic diagram of a planar graphene sheet containing a plurality of graphene crystals having the zigzag direction oriented at 17 degrees or less with respect to the electric conduction direction.

Figure 3A:
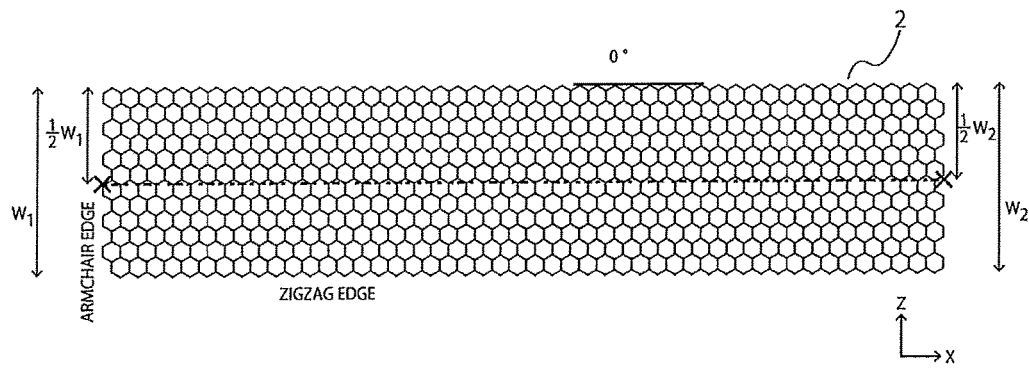
FIGS. 3A, 3B, 3C, 3D are schematic diagram of a planar graphene sheet according to an embodiment.

FIG. 3A is a schematic diagram of a planar graphene sheet formed of graphene crystals having the zigzag direction oriented at 0 degrees with respect to the electric conduction direction. The multilayer graphene 2 is, for example, a laminate of the planar graphene sheets of FIG. 3A. The electric conduction direction is a direction of a line segment connecting center points at both ends of the planar graphene sheet in the wiring length direction. More specifically, the width of one end of the planar graphene sheet in the wiring length direction is referred to as $W_1$, and the width of the other end thereof is referred to as $W_2$. A line segment connecting a point of $½W_1$ at one end and a point of $½W_2$ at the other end indicates the electric conduction direction. The graphene sheet illustrated in FIG. 3A has no grain boundary and is formed of single crystals. The graphene sheet is formed of single crystals and the zigzag direction and the electric conduction direction are the same as each other, and therefore low resistance wiring is obtained. Incidentally, both ends of the planar graphene sheet in the wiring length direction are armchair edges, and the direction of the armchair edges is perpendicular to the electric conduction direction.

Figure 3B:
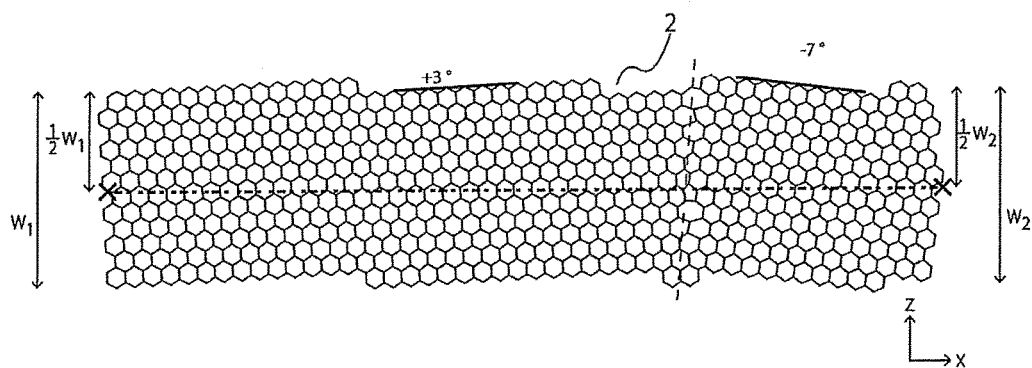

FIG. 3B is a schematic diagram of a planar graphene sheet including graphene crystals having the zigzag direction oriented at 3 degrees with respect to the electric conduction direction and graphene crystals having the zigzag direction oriented at 7 degrees with respect to the electric conduction direction. The multilayer graphene 2 is, for example, a laminate of planar graphene sheets of FIG. 3B. The electric conduction direction and the like are similar to those in FIG. 3A. In the graphene sheet illustrated in FIG. 3B, a majority of graphene crystals has the zigzag direction oriented at 17 degrees or less with respect to the electric conduction direction. Such a planar graphene sheet includes a grain boundary because the graphene sheet includes graphene crystals having different crystal orientations and the graphene crystals are connected to each other. The grain boundary includes defects, a 5-membered ring structure, a 7-membered ring structure, and the like in addition to a 6-membered ring structure. Even such a polycrystalline graphene sheet has a crystal orientation, and therefore the zigzag direction thereof is close to the electric conduction direction. Therefore, the band gap of the graphene sheet is small, and the multilayer graphene 2 obtained by laminating the graphene sheet is also low resistance wiring. Graphene crystals oriented in the zigzag direction at 7 degrees with respect to the electric conduction direction have an inclination of 10 degrees with respect to graphene crystals oriented in the zigzag direction at 3 degrees with respect to the electric conduction direction. However, each of these inclinations has the zigzag direction oriented at 17 degrees or less with respect to the electric conduction direction, and therefore a low resistance wiring material is obtained. The multilayer graphene 2 obtained by laminating monocrystalline graphene sheets as illustrated in FIG. 3A is ideal. However, it is not easy to completely control the crystal orientation with a wiring length of 100 μm or more, for example. When a complete crystal orientation is obtained, the yield is low, and such a case is not practical. However, even if the crystal orientation cannot be controlled completely, when the crystal orientation can be controlled to a certain extent, the multilayer graphene 2 is suitable as low resistance wiring. The multilayer graphene 2 according to the first embodiment has an advantage in that the multilayer graphene 2 is relatively low resistance wiring within a range in which control of the crystal orientation is easy. The multilayer graphene 2 which cannot completely control the crystal orientation but is low resistance wiring includes graphene crystals having the zigzag direction oriented at 1 degree or more and 17 degrees or less with respect to the electric conduction direction.

Figure 3C:
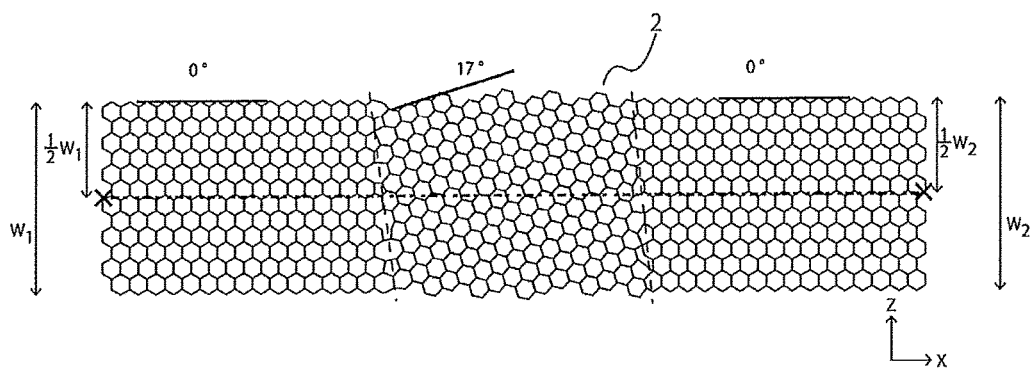

FIG. 3C is a schematic diagram of a planar graphene sheet including graphene crystals having the zigzag direction oriented at 0 degrees with respect to the electric conduction direction, graphene crystals having the zigzag direction oriented at 17 degrees with respect to the electric conduction direction, and graphene crystals having the zigzag direction oriented at 0 degrees with respect to the electric conduction direction. The multilayer graphene 2 is, for example, a laminate of planar graphene sheets of FIG. 3C. The electric conduction direction and the like are similar to those in FIG. 3A. In the graphene sheet illustrated in FIG. 3C, a majority of graphene crystals has the zigzag direction oriented at 17 degrees or less with respect to the electric conduction direction. Like the graphene sheet of FIG. 3B, the grain boundary includes defects, a 5-membered ring, and the like. Graphene crystals having the zigzag direction oriented at 17 degrees with respect to the electric conduction direction are included, but the angle is 17 degrees or less. Therefore, the multilayer graphene 2 obtained by laminating planar graphene sheets of FIG. 3C has also low resistance similarly to that of FIG. 3B.

Figure 3D:
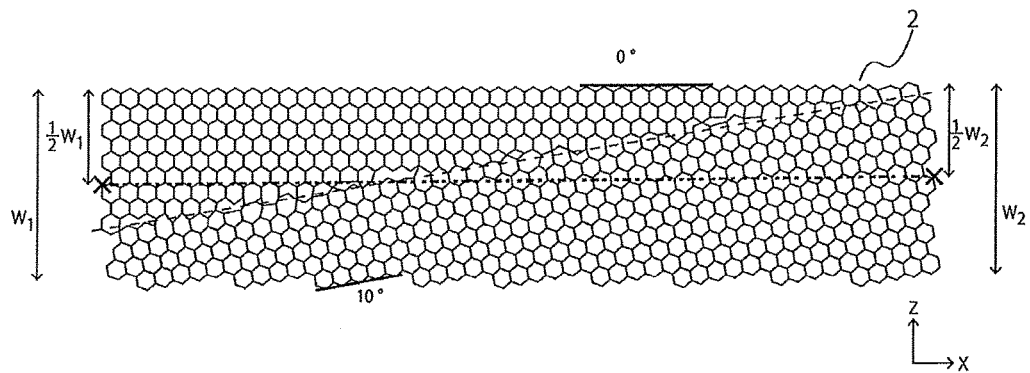

FIG. 3D is a schematic diagram of a planar graphene sheet including graphene crystals having the zigzag direction oriented at 0 degrees with respect to the electric conduction direction and graphene crystals having the zigzag direction oriented at 10 degrees with respect to the electric conduction direction. The electric conduction direction and the like are similar to those of FIG. 3A. In the planar graphene sheets of FIG. 3B and FIG. 3C, grain boundaries are present along a direction nearly perpendicular to the electric conduction direction. Meanwhile, the grain boundary of the planar graphene sheet of FIG. 3D extends in the wiring length direction, and faces a direction close to the electric conduction direction. Even in the structure having such a grain boundary, a majority of graphene crystals has the zigzag direction oriented at 17 degrees or less with respect to the electric conduction direction. Therefore, the multilayer graphene 2 obtained by laminating planar graphene sheets of FIG. 3D is also preferable because of its low resistance. In each of the planar graphene sheets illustrated in FIGS. 3A to 3D, the zigzag direction of graphene crystals is oriented at 17 degrees or less with respect to the electric conduction direction except for the grain boundary.

Figure 4:
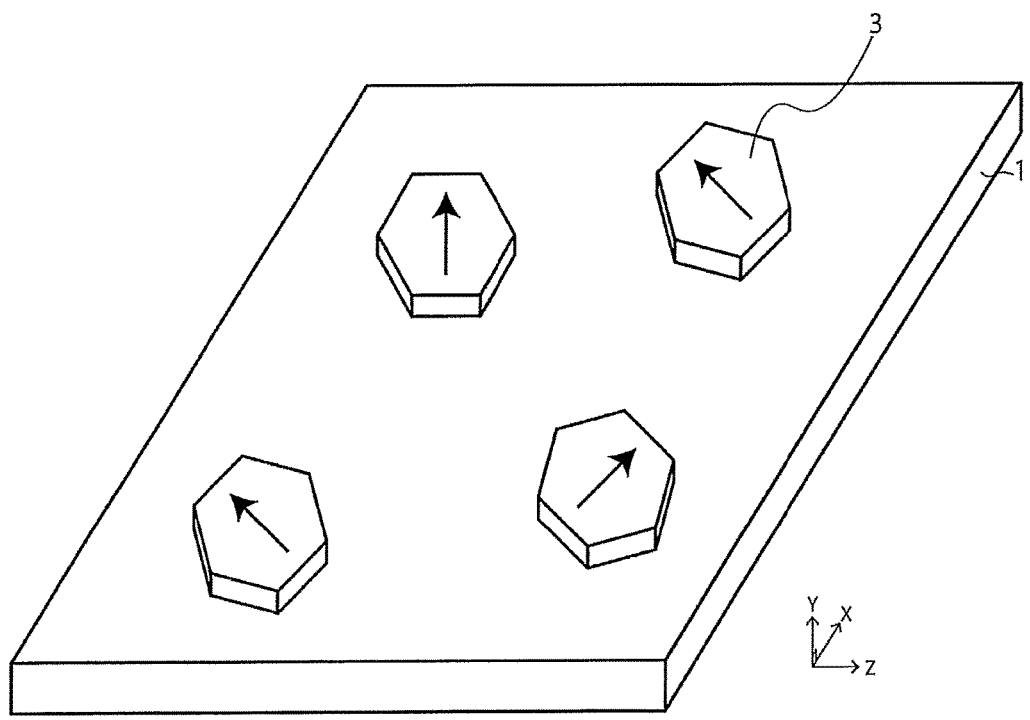
FIG. 4 is a process diagram of a graphene wiring structure according an embodiment.
Figure 5:
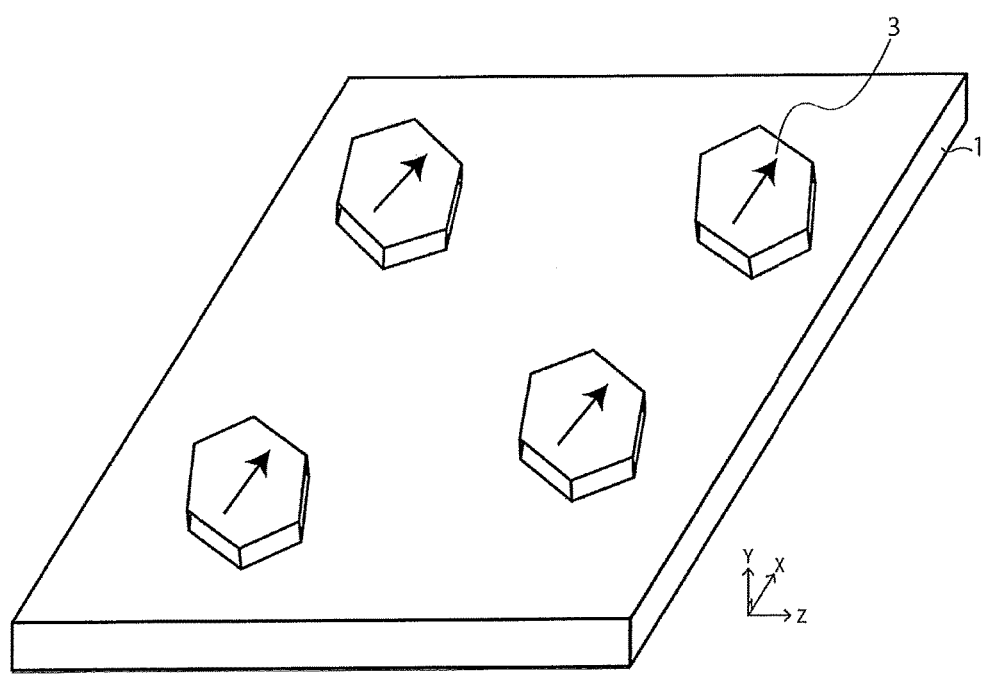
FIG. 5 is a process diagram of a graphene wiring structure according to an embodiment.
Figure 6:
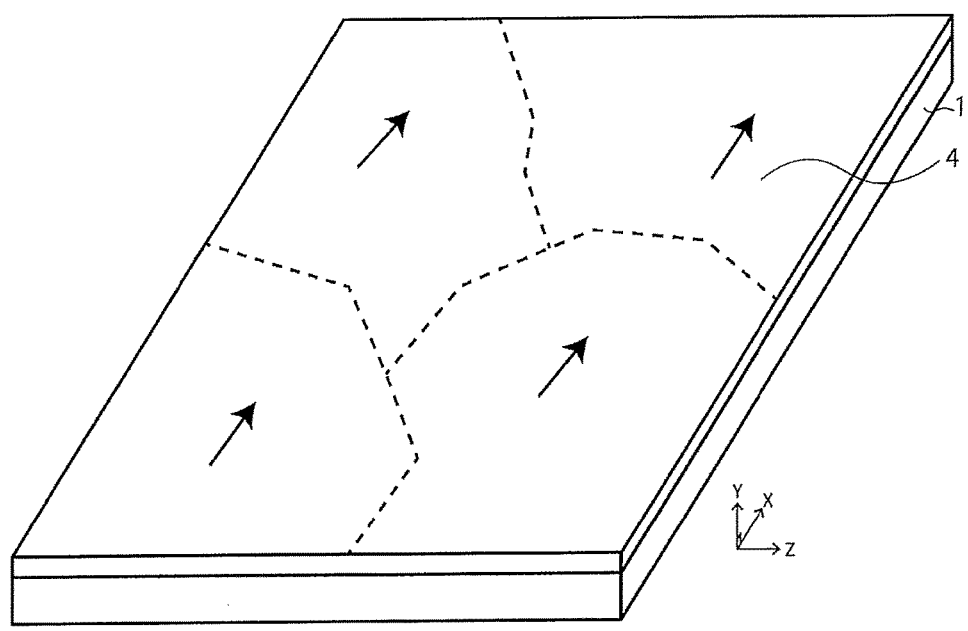
FIG. 6 is a process diagram of a graphene wiring structure according to an embodiment.

Next, a method for manufacturing the graphene wiring structure 10 according to the first embodiment will be described with reference to the drawings. Process diagrams of the graphene wiring structure 10 illustrated in FIGS. 4 to 6 are process diagrams for manufacturing the graphene wiring structure 10 illustrated in the schematic diagram of FIG. 7. FIGS. 4 to 7 are perspective diagrams. In the process diagram of FIG. 4, a member provided with microcrystalline graphene 3 on the insulating film 1 is illustrated. The microcrystalline graphene 3 is a small graphene crystal of, for example, about 10 nm to 10000 nm. FIG. 4 illustrates the zigzag direction of the microcrystalline graphene 3. The insulating film 1 is not formed of single crystals but is polycrystalline. Therefore, when the microcrystalline graphene 3 is provided on the insulating film 1, the crystal orientation is random due to an influence of crystallinity of the insulating film 1. When the graphene is grown as it is from this microcrystalline graphene 3, the graphene extends depending on its crystallinity, and therefore a polycrystalline graphene having a random crystal orientation is formed. In the embodiment, a treatment for making the orientation of the microcrystalline graphene 3 uniform is performed. Examples of the microcrystalline graphene 3 include a single crystal graphene (single layer or multilayer) such as a single layer graphene grown from a single crystal catalyst, a multilayer graphene grown from a single crystal catalyst, or a multilayer graphene obtained by organic synthesis. The microcrystalline graphene 3 has a small area, and therefore the microcrystalline graphene 3 formed of single crystals can be easily manufactured.

Examples of a treatment for making the orientation of the microcrystalline graphene 3 uniform include, first, a method using a liquid crystal. A liquid crystal is applied onto the insulating film 1 provided with the microcrystalline graphene 3 having a random crystal orientation, and a photo-orientation film is provided on the applied liquid crystal and is irradiated with light. The orientation of the liquid crystal thereby becomes uniform. At this time, the microcrystalline graphene 3 is influenced by change in orientation of the liquid crystal, and the orientation of the microcrystalline graphene 3 becomes uniform like the liquid crystal. Then, it is only required to remove the photo-orientation film and the liquid crystal. It is preferable to use at least one compound selected from the group consisting of an azobenzene derivative, a stilbene derivative, a cyanobiphenyl, an azoxybenzene derivative, a carbonate derivative, and a fluorine-containing biphenyl. These compounds each have a 6-membered ring structure containing carbon atoms like a graphene, and therefore have an influence on the crystal orientation of the microcrystalline graphene 3. The liquid crystal is preferably a compound having a molecular skeleton similar to a graphene of a six-membered ring structure or the like.

Other examples of a treatment for making the orientation of the microcrystalline graphene 3 uniform include a method using polarity of the insulating film 1 and a liquid crystal. A compound in which a plurality of hydrophilic groups and hydrophobic groups are alternately aligned is used for the insulating film 1. A liquid crystal having a hydrophilic group at one end and a hydrophobic group at the other end, and the microcrystalline graphene 3 are mixed, and the resulting mixture is applied onto the insulating film 1. As a result, the hydrophilic groups of the liquid crystal are aligned on a hydrophilic side of the insulating film 1, and the hydrophobic groups of the liquid crystal are aligned on a hydrophobic side of the insulating film 1. The liquid crystal is arranged on the insulating film 1 such that the orientation of the microcrystalline graphene 3 is also uniform due to the orientation of the liquid crystal. Then, it is only required to remove the liquid crystal.

Through any of the above treatments, a member in which the microcrystalline graphene 3 having a uniform crystal orientation is provided on the polycrystalline insulating film 1 illustrated in FIG. 5 is manufactured. In FIG. 4, the directions of the arrows are not uniform, but in FIG. 5, the directions of the arrows are uniform. With this method, the orientation of crystals can be controlled, and therefore it is possible to make the electric conduction direction in a case of processing into a wiring shape and the zigzag direction of a graphene uniform. A member provided with the microcrystalline graphene 3 having a uniform crystal orientation on the polycrystalline insulating film 1 is also manufactured by transferring the microcrystalline graphene 3 having a uniform crystal orientation onto the insulating film 1.

Examples of a method for transferring the microcrystalline graphene 3 having a uniform crystal orientation onto the insulating film 1 include a method for providing the microcrystalline graphene 3 on a film having an oriented side chain such as a photo-orientation film, and transferring the microcrystalline graphene 3 onto the insulating film 1. The microcrystalline graphene 3 is bonded to an oriented side chain of a photo-orientation film or the like, and light irradiation is performed to make the orientation of the oriented side chains to which the microcrystalline graphene 3 is bonded uniform. Like a graphene, this oriented side chain also has a molecular skeleton similar to a graphene of a 6-membered ring structure containing a carbon atom or the like. The orientation of the microcrystalline graphene 3 can be thereby made uniform. By transferring the microcrystalline graphene 3 having a uniform orientation onto the insulating film 1, the microcrystalline graphene 3 having a uniform crystal orientation as illustrated in the process diagram of FIG. 5 is formed on the insulating film 1.

Other examples of a method for transferring the microcrystalline graphene 3 having a uniform crystal orientation onto the insulating film 1 include a method for transferring the microcrystalline graphene 3 by processing a monocrystalline graphene having a known crystal orientation into a mold or the like.

Other examples of the method for transferring the microcrystalline graphene 3 having a uniform crystal orientation onto the insulating film 1 include a method using a graphene nanoribbon having a uniform crystal orientation in place of the microcrystalline graphene 3. A plurality of graphene nanoribbons having a uniform crystal orientation and a polymer are mixed. As a result, the graphene nanoribbons having a uniform orientation are in contact with the polymer. At this time, the polymer has bent portions randomly, and therefore the crystal orientation in a single graphene nanoribbon is uniform. However, the plurality of graphene nanoribbons each having a uniform orientation faces a random direction. Here, when the polymer is stretched, the plurality of graphene nanoribbons each having a uniform crystal orientation faces the same direction (within ±10 degrees) while being in contact with the stretched polymer. By transferring the plurality of graphene nanoribbons each having a uniform crystal orientation and facing the same direction (within ±10 degrees) to the insulating film 1, the plurality of graphene nanoribbons each having a uniform crystal orientation and facing the same direction (within ±10 degrees) as illustrated in the process diagram of FIG. 5 (microcrystalline graphene 3) is formed on the insulating film 1.

In the member provided with the microcrystalline graphene 3 having a uniform crystal orientation on the polycrystalline insulating film 1, illustrated in the process diagram of FIG. 5, when a graphene is additionally grown with the microcrystalline graphene 3 as a nucleus, as illustrated in the process diagram of FIG. 6, a member in which the polycrystalline graphene film 4 having a uniform crystal orientation (within ±17 degrees with respect to an electric conduction direction obtained later) is provided on the insulating film 1 is obtained. In FIG. 6, grain boundaries are indicated by a broken line. The average particle diameter of a graphene crystal of the polycrystalline graphene film 4 obtained here is larger than the width of the multilayer graphene 2. This means that the polycrystalline graphene film 4 to become wiring later can be obtained from crystal nuclei having a uniform crystal orientation. The average particle diameter of the graphene crystals is preferably at least five times the width of the multilayer graphene 2. Incidentally, for additional growth of a graphene, a graphene film formation process can be employed. For example, an ethylene gas or an acetylene gas is supplied as a raw material, and plasma chemical vapor deposition (CVD) is performed.

Figure 7:
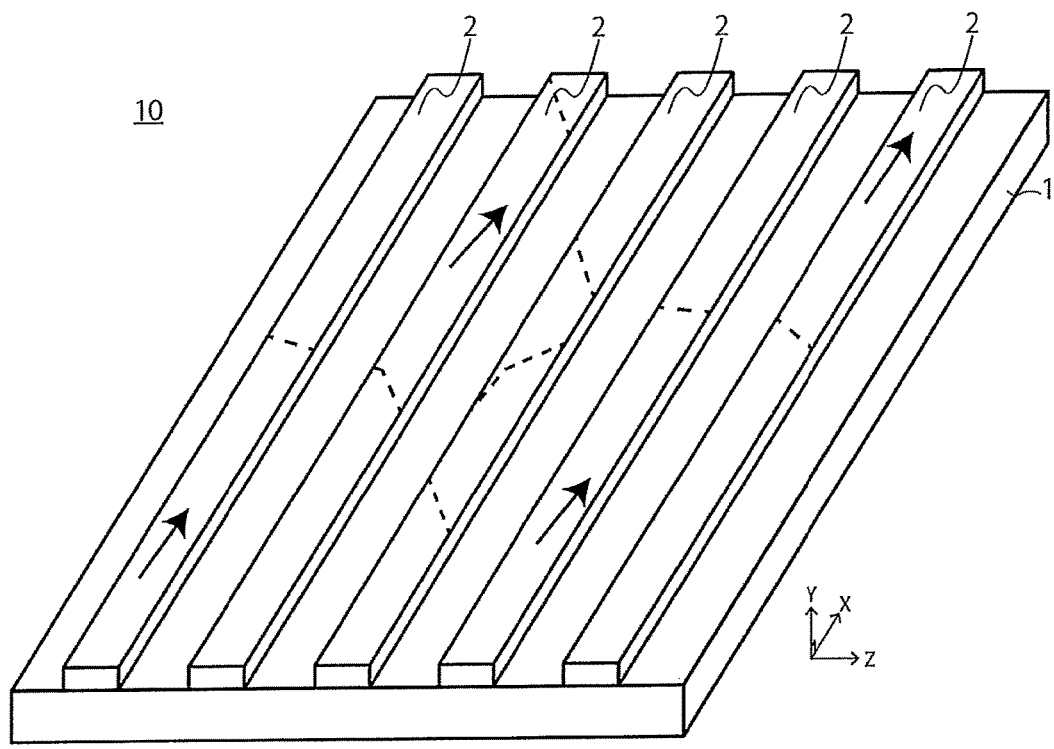
FIG. 7 is a schematic diagram of a graphene wiring structure according to an embodiment.

The member in which the polycrystalline graphene film 4 illustrated in the process diagram of FIG. 6 is provided on the insulating film 1 is patterned into a wiring shape to obtain the graphene wiring structure 10 illustrated in the schematic diagram of FIG. 7. In the schematic diagram of FIG. 7, a plurality of the multilayer graphenes 2 of the graphene wiring structure 10 is present, and is arranged in parallel. A part of the grain boundaries of the polycrystalline graphene film 4 remains even after the member is patterned into a wiring shape, and the crystal orientation of a graphene crystal is uniform. Therefore, low resistance wiring is obtained. Incidentally, by repeating the steps illustrated in FIGS. 4 to 6, it is possible to increase the lamination number of the multilayer graphene 2.

A method for manufacturing the above graphene wiring structure 10 using a liquid crystal according to the first embodiment will be described specifically with reference to of the schematic cross-sectional diagrams of FIGS. 8 and 9. These manufacturing methods describe a step for making a crystal orientation of a graphene between FIGS. 4 and 5 uniform. The steps of FIGS. 6 and 7 are common to the above-described manufacturing method.

Figure 8:
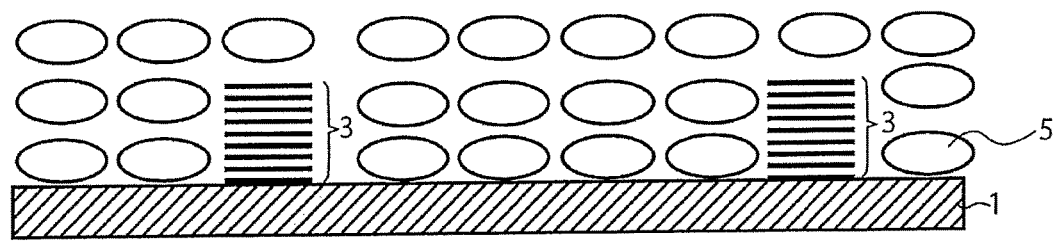
FIG. 8 is a process diagram of a graphene wiring structure according to an embodiment.
Figure 9:
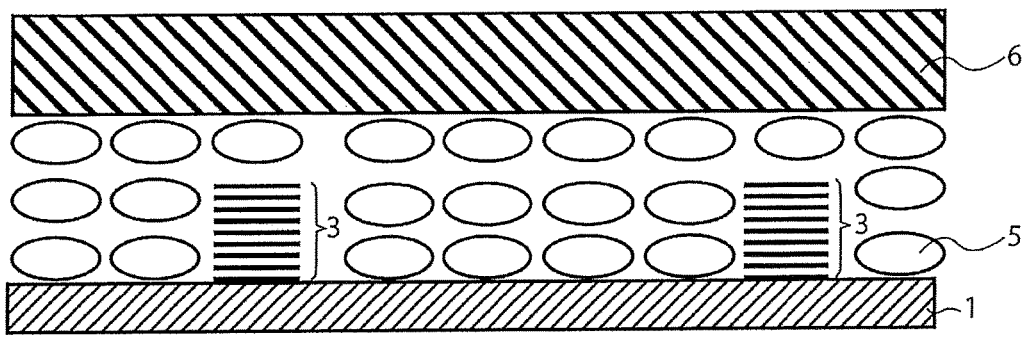
FIG. 9 is a process diagram of a graphene wiring structure according to an embodiment.

A method for manufacturing the graphene wiring structure 10 including the steps of the schematic diagrams illustrated in FIGS. 8 and 9 includes a step of providing the microcrystalline graphene 3 on the insulating film 1, applying a liquid crystal 5 onto the insulating film 1 on a side where the microcrystalline graphene 3 is provided and onto the microcrystalline graphene 3, a step of forming a photo-orientation film 6 on the liquid crystal 5, a step of irradiating the photo-orientation film 6 with polarized light, a step of removing the liquid crystal 5 and the photo-orientation film 6, a step of growing the microcrystalline graphene 3 into the polycrystalline graphene film 4, and a step of patterning the polycrystalline graphene film 4 into a wiring shape.

In the schematic diagram of FIG. 8, the microcrystalline graphene 3 and the liquid crystal 5 are illustrated on the insulating film 1. The crystal orientation of the microcrystalline graphene 3 is random and is provided on a part of the insulating film 1. The liquid crystal 5 is disposed in a layered shape so as to cover the insulating film 1 and the microcrystalline graphene 3. The microcrystalline graphene 3 is disposed between the insulating film 1 and the liquid crystal 5.

The member illustrated in the schematic diagram of FIG. 8 is manufactured by the following method. The multilayered microcrystalline graphene 3 manufactured by CVD or the like is provided on the insulating film 1. At this time, the insulating film 1 is not a single crystal film, and therefore the crystal orientation of the microcrystalline graphene 3 disposed on the insulating film 1 is random. The liquid crystal (liquid crystal composition) 5 is applied onto the surface of the insulating film 1 on which the randomly oriented microcrystalline graphene 3 is provided to obtain the member illustrated in the schematic diagram of FIG. 8.

If an interaction between the liquid crystal 5 and the microcrystalline graphene 3 is small, it is difficult to control the crystal orientation of the microcrystalline graphene 3 due to the liquid crystal. Therefore, the liquid crystal is preferably a compound having a 6-membered ring structure in a molecule of the liquid crystal in order to increase the interaction with the graphene. Suitable examples of the liquid crystal include a compound having an azobenzene skeleton and a compound having a biphenyl skeleton.

The photo-orientation film 6 is provided in the member illustrated in the schematic diagram of FIG. 8 to obtain the member illustrated in the schematic cross-sectional diagram of FIG. 9. The photo-orientation film 6 is provided on the liquid crystal 5. Then, the photo-orientation film 6 is irradiated with polarized light, and the crystal orientation of the microcrystalline graphene 3 is controlled together with the liquid crystal 5. In consideration of a wiring direction, a polarization direction for irradiation is selected such that the wiring length direction is the zigzag direction of the graphene. Then, the liquid crystal 5 and the photo-orientation film 6 are removed to obtain a member having a uniform crystalline orientation of the microcrystalline graphene 3 as illustrated in FIG. 6. Subsequently, a treatment of additional growth of the graphene and patterning into a wiring shape are performed to obtain the graphene wiring structure 10.

Second Embodiment

A second embodiment is a modified example of the method for manufacturing the graphene wiring structure 10 according to the first embodiment. The method for manufacturing the graphene wiring structure 10 according to the second embodiment includes a step of providing first microcrystalline graphene 3A having a uniform crystal orientation on an insulating film 1, a step of growing the first microcrystalline graphene 3A having a uniform crystal orientation on the insulating film 1 into a first polycrystalline graphene film 4A, a step of providing second microcrystalline graphene 3B on the first polycrystalline graphene film 4A, a step of heating the second microcrystalline graphene 3B on the first polycrystalline graphene film 4A to 2000° C. or higher and 3000° C. or lower, a step of growing the heated second microcrystalline graphene 3B into a second polycrystalline graphene film 4B and laminating the first polycrystalline graphene film 4A and the second polycrystalline graphene film 4B, and a step of patterning the laminated first polycrystalline graphene film 4A and the second polycrystalline graphene film 4B into a wiring shape.

Figure 10A:
FIGS. 10A, 10B, 10C, 10D are process diagrams of a graphene wiring structure according to an embodiment.
Figure 10B:
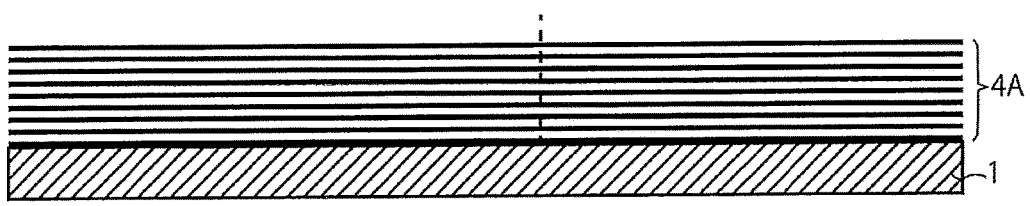

The second embodiment will be described with reference to the process diagrams of FIGS. 10A to 10D. FIG. 10A illustrates a member in which the first microcrystalline graphene 3A is provided on the insulating film 1. The crystal orientation of this first microcrystalline graphene 3A is made uniform by the method described in the first embodiment. For the member illustrated in the process diagram of FIG. 10A, additional growth of a graphene is performed in a similar manner to the first embodiment, and the member in which the first polycrystalline graphene film 4A is provided on the insulating film 1 illustrated in the process diagram of FIG. 10B is obtained.

Figure 10C:
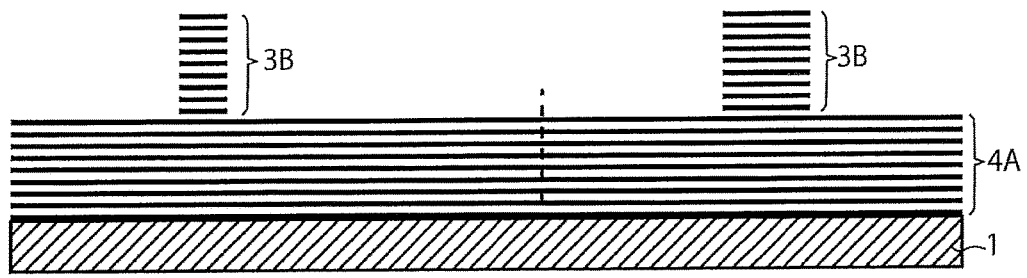
Figure 10D:
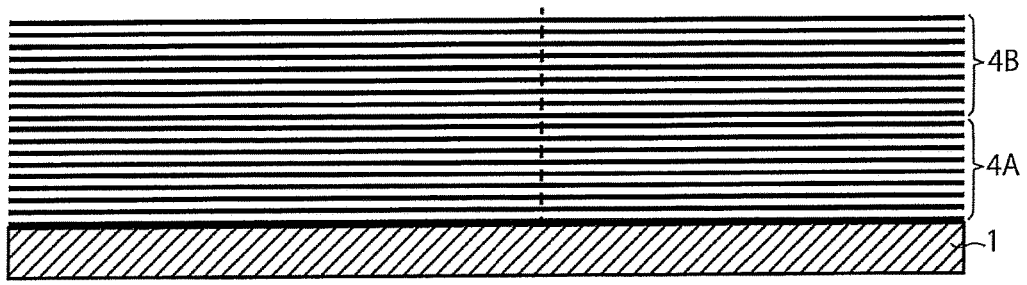

Then, as illustrated in the process diagram of FIG. 10C, the second microcrystalline graphene 3B is further provided on the first polycrystalline graphene film 4A. The crystal orientation of the first polycrystalline graphene film 4A is uniform. Therefore, due to an influence of crystallinity of the first polycrystalline graphene film 4A, the crystal orientation of the second microcrystalline graphene 3B may be partly aligned with that of the first polycrystalline graphene film 4A. However, not all the orientations of the second microcrystalline graphene 3B are aligned with the orientation of the first polycrystalline graphene film 4A. Therefore, if additional growth of a graphene is performed as it is, resistance of the multilayer graphene 2 on an upper layer side is increased. Therefore, in the embodiment, a heat treatment is performed, and the crystal orientation of the second microcrystalline graphene 3B is aligned with the crystal orientation of the first polycrystalline graphene film 4A. In the heat treatment, a region where the second microcrystalline graphene 3B is present is preferably subjected to local laser heating. The heating temperature is preferably 2000° C. or higher and 3000° C. or lower. Then, as illustrated in the process diagram of FIG. 10D, the second microcrystalline graphene 3B is additionally grown to form the second polycrystalline graphene film 4B. A member in which the first polycrystalline graphene film 4A and the second polycrystalline graphene film 4B are laminated is obtained on the insulating film 1. The laminated first polycrystalline graphene film 4A and second polycrystalline graphene film 4B are patterned in a wiring shape to obtain the graphene wiring structure 10. Also in FIGS. 10A to 10D, grain boundaries of the polycrystalline graphene film 4 is indicated by a broken line.

Third Embodiment

Figure 11A:
FIGS. 11A and 11B are process diagrams of a graphene wiring structure according to an embodiment.
Figure 11B:
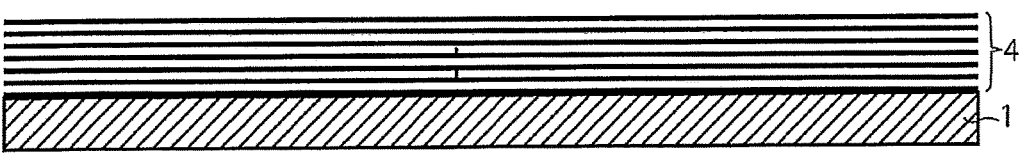

A third embodiment is a modified example of the method for manufacturing the graphene wiring structure 10 according to the first or second embodiment. The third embodiment will be described with reference to the process diagrams of FIGS. 11A and 11B. FIG. 11A illustrates a member in which microcrystalline graphene 3 is provided on an insulating film 1. The crystal orientation of this microcrystalline graphene 3 is made uniform by the method described in the first embodiment. The lamination number of graphenes of this microcrystalline graphene 3 is different. For the member illustrated in the process diagram of FIG. 11A, additional growth of a graphene is performed in a similar manner to the first embodiment, and the member in which a polycrystalline graphene film 4 is provided on the insulating film 1 illustrated in the process diagram of FIG. 11B is obtained. The lamination number of graphenes of the microcrystalline graphene 3 is different at the stage illustrated in the process diagram of FIG. 11A. Therefore, a grain boundary is not present on an upper layer side of the polycrystalline graphene film 4, but a grain boundary is present on a lower layer side thereof in FIG. 11B. Even with the polycrystalline graphene film 4, by making the crystal orientation of the microcrystalline graphene 3 uniform, the graphene wiring structure 10 obtained by patterning the polycrystalline graphene film 4 into a wiring shape has low resistance. Also in FIGS. 11A and 11B, a grain boundary of the polycrystalline graphene film 4 is indicated by a broken line.

Fourth Embodiment

Figure 12:
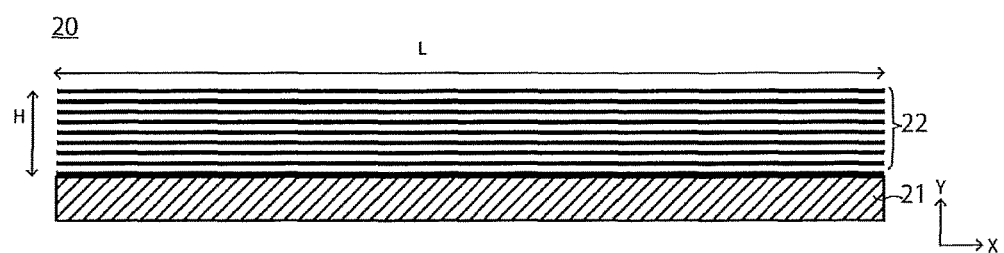
FIG. 12 is a schematic diagram of a wiring structure according to an embodiment.

A fourth embodiment is a modified example of the graphene wiring structure 10 according to the first embodiment. FIG. 12 illustrates a schematic cross-sectional diagram of a graphene wiring structure 20 according to the fourth embodiment. The wiring structure 20 according to the fourth embodiment includes an insulating film 21 and a wiring layer 22 having a uniform crystal orientation on the insulating film 21. Crystals of the wiring layer 22 preferably have the zigzag direction oriented at 17 degrees or less with respect to the electric conduction direction.

A method for manufacturing the wiring structure 20 according to the fourth embodiment includes a step of providing a crystal layer 23 on the insulating film 21, a step of applying a liquid crystal 24, a monomer 25, and a polymerization initiator 26 onto the crystal layer 23, a step of irradiating the liquid crystal 24, the monomer 25, and the polymerization initiator 26 on the crystal layer 23 with a polarized ultraviolet ray, and polymerizing the monomer 25 on a crystal layer 23A in which crystals are oriented in a polarization direction to form a polymer mask 27 on the crystal layer 23A, a step of removing the liquid crystal 24, the monomer 25, and the polymerization initiator 26 on a crystal layer 23B in which crystals are not oriented in an ultraviolet ray polarization direction, and the liquid crystal 24 and the polymerization initiator 26 on the crystal layer 23A in which crystals are oriented in the polarization direction, a step of etching the crystal layer 23B in which crystals are not oriented in the ultraviolet ray polarization direction using the polymer mask 27, a step of removing the polymer mask 27 on the crystal layer 23A in which crystals have been oriented in the ultraviolet ray polarization direction, a step of additionally growing the crystal layer 23A in which crystals have been oriented in the ultraviolet ray polarization direction into a crystal film 28, and a step of patterning the crystal film 28 into a wiring shape.

The insulating film 21 is the insulating film 1 according to the first embodiment and is an amorphous or polycrystalline film.

The wiring layer 22 is a conductive member having uniform crystal orientation. The wiring layer 22 is the multilayer graphene 2 according to the first embodiment or hexagonal boron nitride. Like the multilayer graphene 2, crystals of hexagonal boron nitride preferably has the zigzag direction oriented at 17 degrees or less with respect to the electric conduction direction.

Next, a method for manufacturing the wiring structure 20 according to the fourth embodiment will be described with reference to the drawings. The process diagrams of the wiring structure 20 illustrated in FIGS. 13 to 19 are process diagrams for manufacturing the wiring structure 20 illustrated in the schematic diagram of FIG. 12. FIGS. 13 to 19 are top diagrams viewed from a Y direction.

Figure 13:
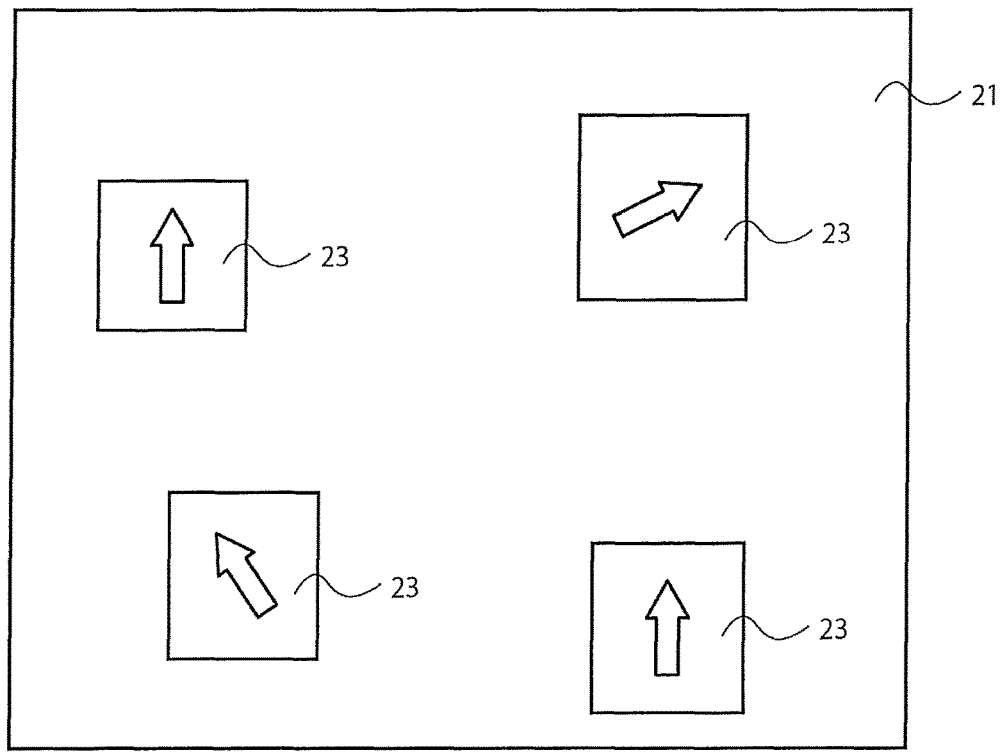
FIG. 13 is a process diagram of a wiring structure of an embodiment.

First, as illustrated in the process diagram of FIG. 13, a plurality of the crystal layers 23 is provided on the insulating film 21. The crystal orientation of the plurality of crystal layers 23 is not uniform, and therefore is random. The crystal layer 23 is preferably multilayer graphene, multilayer hexagonal boron nitride, or the like.

Figure 14:
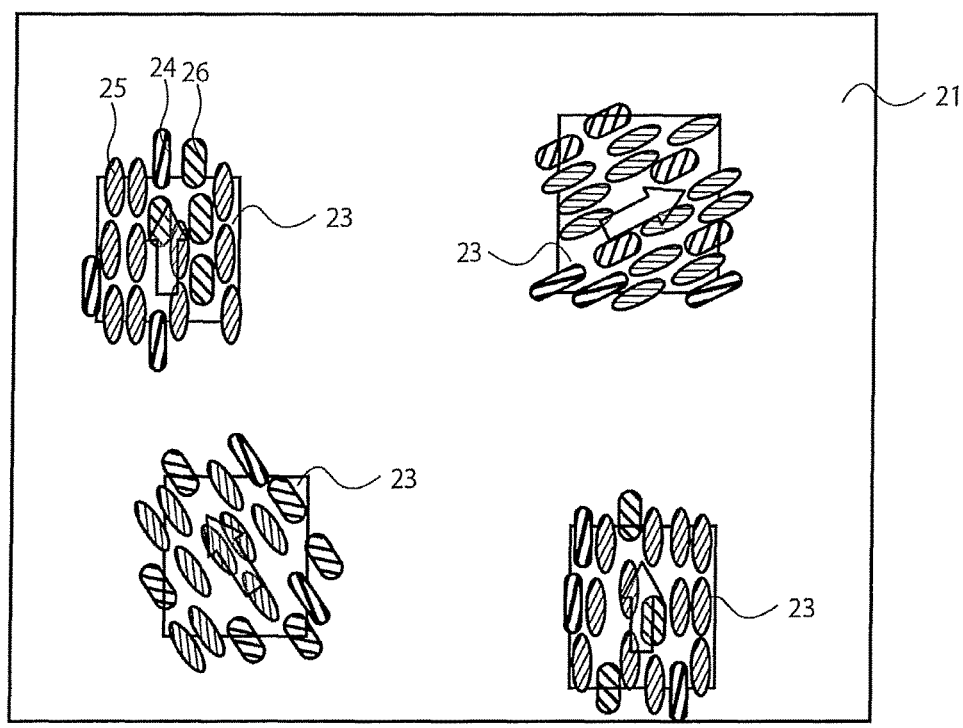
FIG. 14 is a process diagram of a wiring structure of an embodiment.

Subsequently, as illustrated in the process diagram of FIG. 14, the liquid crystal 24, the monomer 25, and the polymerization initiator 26 are applied onto the crystal layer 23. The liquid crystal 24 and the polymerization initiator 26 are oriented in a direction aligned with the crystal orientation of the crystal layer 23. The liquid crystal 24, the monomer 25, and the polymerization initiator 26 may also be applied onto the insulating film 21. The liquid crystal 24 is preferably a compound having a large interaction with a six-membered ring structure contained in the crystal layer 23. Preferred specific examples of the liquid crystal 24 include a compound having a biphenyl skeleton such as 4-cyano-4'-pentylbiphenil. Preferred examples of the monomer 25 include an acrylic monomer such as 2-ethylhexyl acrylate, 1,3,3-trimethylhexylacrylate, or n-hexylacrylate. Preferred examples of the polymerization initiator 26 include those having a property of releasing many radicals when directions of an electric field of polarized light and the polymerization initiator are matched like a compound represented by the following chemical formula 1.

Chemical formula 1

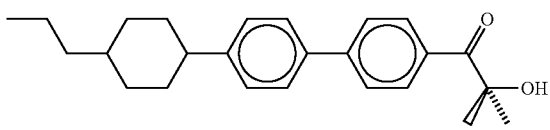

For the liquid crystal 24, the monomer 25, and the polymerization initiator 26, three kinds of compounds may be used. Alternatively, a liquid crystal monomer and a polymerization initiator, a monomer having a liquid crystal property and a property as a polymerization initiator, or the like may be used as long as the compound to be applied has those properties.

Figure 15:
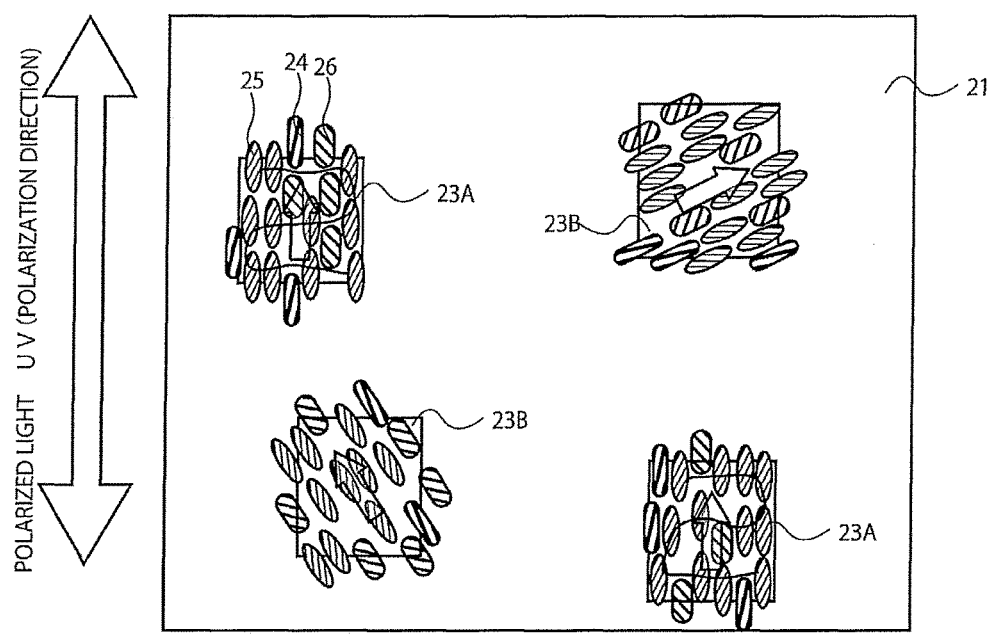
FIG. 15 is a process diagram of a wiring structure of an embodiment.

Subsequently, as illustrated in the process diagram of FIG. 15, the liquid crystal 24, the monomer 25, and the polymerization initiator 26 on the crystal layer 23 are irradiated with a polarized ultraviolet ray. By irradiation with a polarized ultraviolet ray, many radicals are released from the polymerization initiator 26 oriented in an ultraviolet ray polarization direction, a polymerization reaction is started, and the monomer 25 is polymerized to form the polymer mask 27. The polymerization reaction proceeds in the crystal layer 23A having a crystal orientation in the same direction as the polarization direction of ultraviolet light, and the polymerization reaction does not proceed in the crystal layer 23B having no crystal orientation in the same direction as the polarization direction of ultraviolet light. The polymer mask 27 is formed on the crystal layer 23A having a crystal orientation in the same direction as the polarization direction of ultraviolet light, and the polymer mask 27 is not formed on the crystal layer 23B having no crystal orientation in the same direction as the polarization direction of ultraviolet ray.

Figure 16:
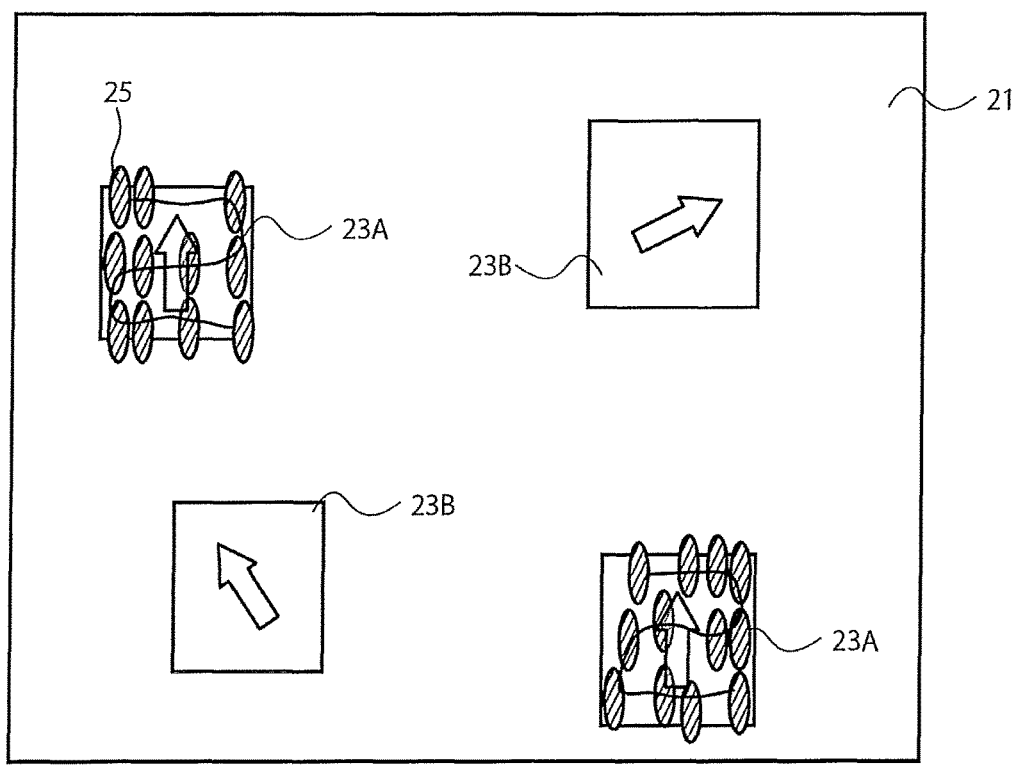
FIG. 16 is a process diagram of a wiring structure of an embodiment.

Subsequently, as illustrated in the process diagram of FIG. 16, the liquid crystal 24, the monomer 25, and the polymerization initiator 26 on the crystal layer 23B in which crystals are not oriented in the ultraviolet ray polarization direction, and the liquid crystal 24 and the polymerization initiator 26 on the crystal layer 23A having a crystal orientation in the same direction as the ultraviolet ray polarization direction are removed. As a removal method, it is only required to perform development using an organic solvent for dissolving the liquid crystal 24, the monomer 25, and the polymerization initiator 26 but not dissolving the polymer mask 27.

Figure 17:
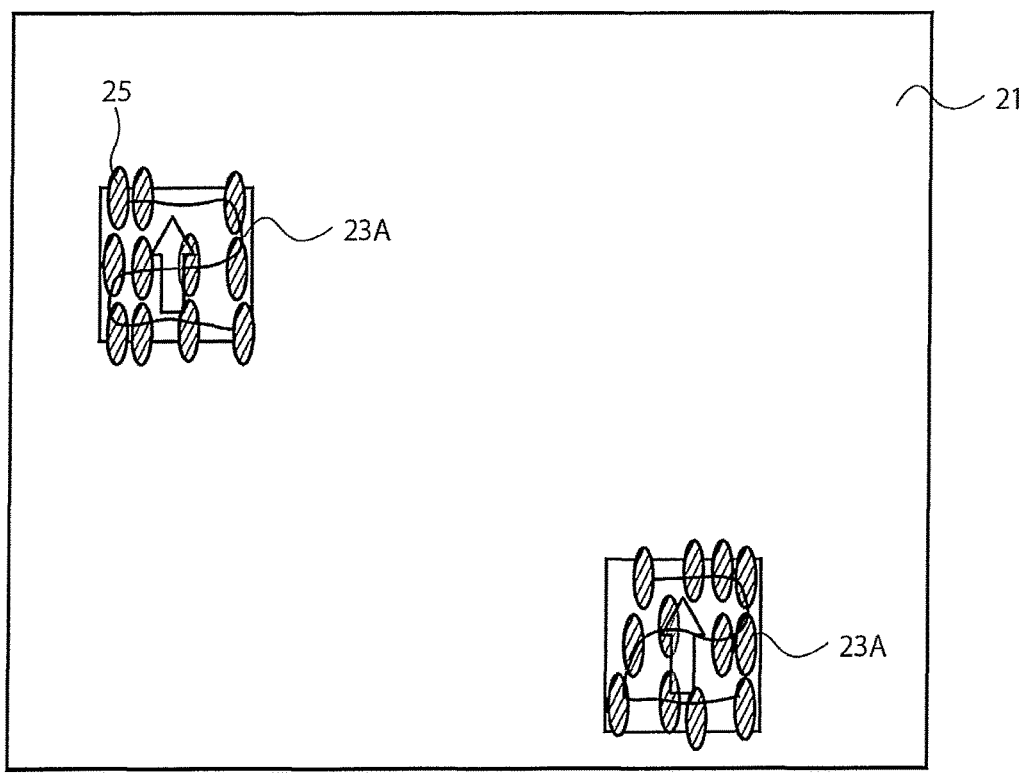
FIG. 17 is a process diagram of a wiring structure of an embodiment.

Subsequently, as illustrated in the process diagram of FIG. 17, the crystal layer 23B in which crystals are not oriented in the ultraviolet orientation direction is etched using the polymer mask 27. Removal can be performed by etching the crystal layer 23B using a reactive ion etching apparatus (RIE) and using $O_2$ as an etching gas.

Figure 18:
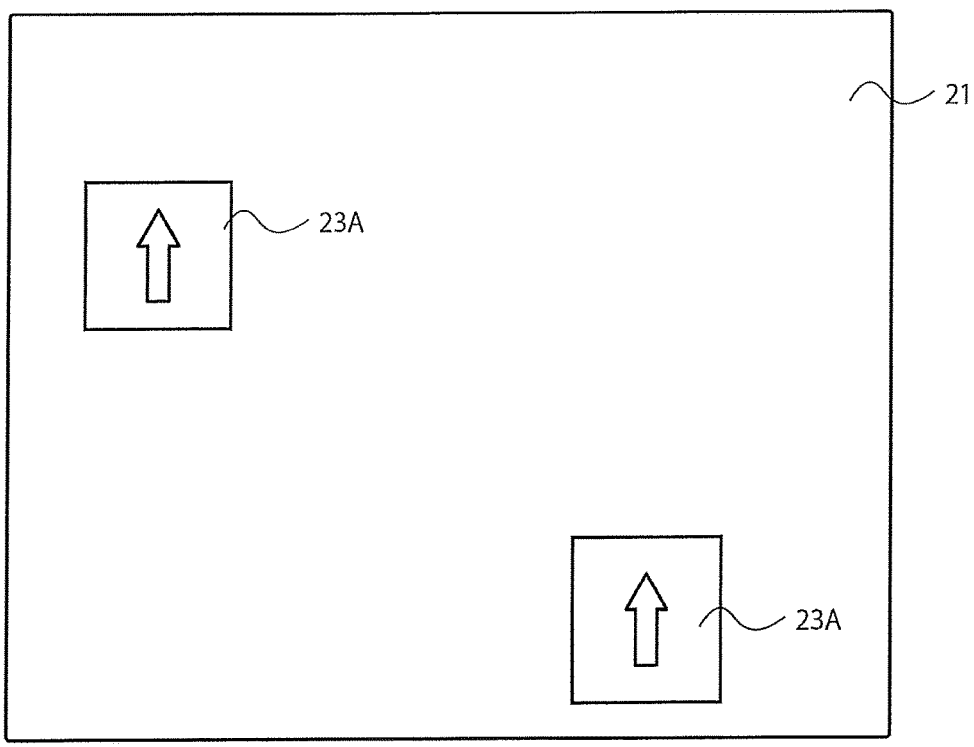
FIG. 18 is a process diagram of a wiring structure of an embodiment.

Subsequently, as illustrated in the process diagram of FIG. 18, the polymer mask 27 on the crystal layer 23A in which crystals have been oriented in the ultraviolet ray polarization direction is removed. It is only required to anneal the polymer mask 27, for example. By performing annealing or the like, as illustrated in the process diagram of FIG. 18, when the polymer mask 27 is removed, a member in which the crystal layer 23A having a uniform crystal orientation is disposed is obtained on the insulating film 21. The member illustrated in the process diagram of FIG. 18 has a uniform crystal orientation like the member illustrated in FIG. 5.

Figure 19:
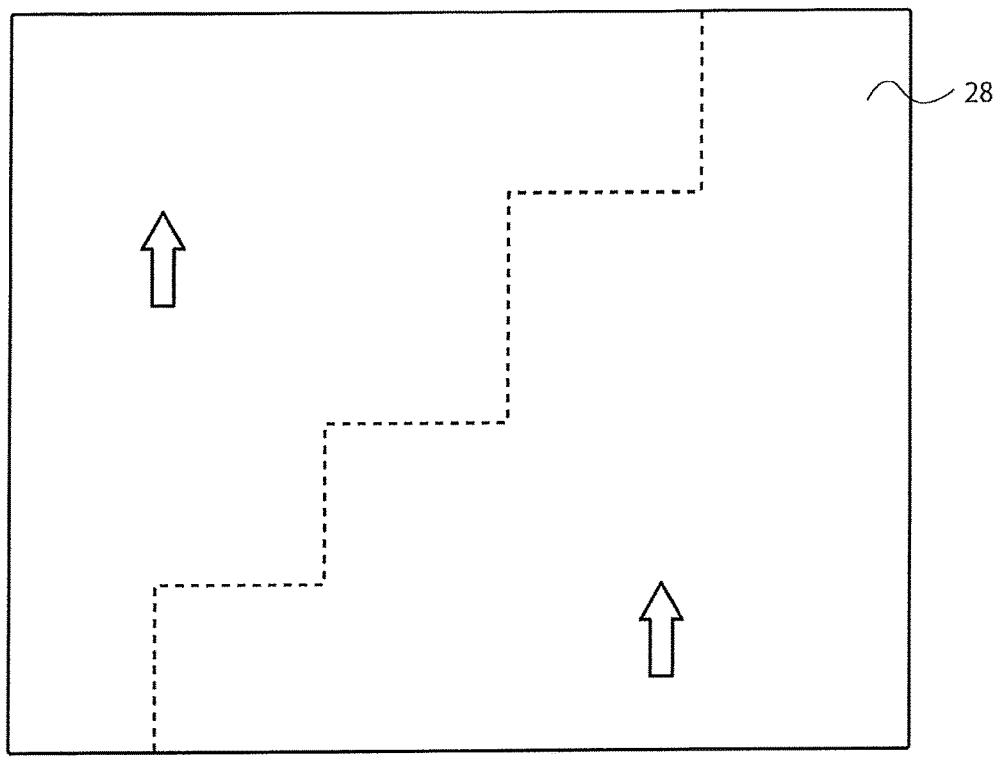
FIG. 19 is a process diagram of a wiring structure of an embodiment.

Subsequently, as illustrated in the process diagram of FIG. 19, the crystal layer 23A in which crystals have been oriented in the ultraviolet ray polarization direction is additionally grown into the crystal film 28. A grain boundary of the crystal film 28 is indicated by a broken line. Then, by patterning the crystal film 28 into a wiring shape, the wiring structure of FIG. 12 is obtained. A perspective diagram of the wiring structure of FIG. 12 is as illustrated in the schematic diagram of FIG. 7.

Incidentally, when the crystal film 28 is grown, crystal orientation may be deviated, and the crystal film 28 with less deviation in the crystal orientation can be obtained by repeating the steps illustrated in the process diagrams of FIGS. 14 to 19. In the process diagrams of FIGS. 13 to 19, the crystal layer 23 formed of small crystals is provided on the insulating film 21, but the present disclosure is not limited thereto. For example, as a modification of the present manufacturing method, by performing the steps illustrated in the process diagrams of FIGS. 14 to 19 on a member in which a polycrystalline crystal layer having non-uniform crystal orientation has been formed on the entire surface of an insulating film 1, portions other than a crystal layer in which crystals are oriented in a specific direction (electric conduction direction of wiring obtained later) are removed. Then, the remaining crystal layer is additionally grown, and a crystal film having a uniform crystal orientation can be formed. When the crystal layer 23 aligned with the ultraviolet ray polarization direction is not present, by repeating the treatment for providing the crystal layer 23, the wiring structure 20 according to the fourth embodiment can be obtained.

Fifth Embodiment

Figure 20:
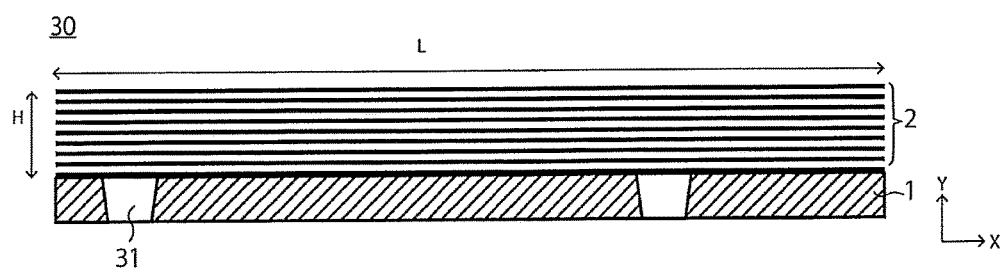
FIG. 20 is a schematic diagram of a graphene wiring structure according to an embodiment.

A fifth embodiment is a modified example of the graphene wiring structure 10 of the first embodiment. FIG. 20 illustrates a schematic cross-sectional diagram of the graphene wiring structure according to the fourth embodiment. A graphene wiring structure 30 of FIG. 20 includes a multilayer graphene 2 on an insulating film 1 and a conductive portion 31 electrically connected to the multilayer graphene 2 in an insulating film 1. In the fifth embodiment, the wiring structure according to the fourth embodiment can also be adopted.

The conductive portion 31 is made of a conductive material including any one of a metal material including metals such as Cu, Au, Al, W, and Ag, a carbon material such as carbon nanotubes, and the like provided in the insulating film. When the conductive portion 31 is made of carbon nanotubes, a length direction of the carbon nanotubes is preferably a lamination direction of the multilayer graphene 2. The conductive portion 31 is directly or indirectly in contact with the multilayer graphene 2. The conductive portion 31 is electrically connected to the multilayer graphene 2. The conductive portion 31 constitutes so-called via wiring. In the graphene wiring structure 30, a plurality of the conductive portions 31 may be present. The plurality of conductive portions 31 is electrically connected to each other via the multilayer graphene 2. The conductive portions 31 are, for example, electrically connected to a semiconductor element (not illustrated).

In the fifth embodiment, a form in which an element is connected to the conductive portions 31 in the insulating film 1, that is, a form in which the multilayer graphene 2 on the insulating film 1 can be connected to an element under the insulating film 1 is illustrated. However, the connection form between the graphene wiring structure according to the fifth embodiment and other elements and the like is not limited to those illustrated. For example, it is possible to adopt a form in which a conductive member is provided at an end of the multilayer graphene 2 and the multilayer graphene 2 is electrically connected to another element via the member, and the like, and the connection form is not limited. The graphene wiring structure according to the fourth embodiment has a more specific configuration in which the low resistance multilayer graphene 2 can be connected to an external element. The multilayer graphene 2 is low resistance wiring. Therefore, a semiconductor device adopting the graphene wiring structure according to the fifth embodiment can reduce power consumption and can speed up a signal output via the graphene wiring structure according to the fifth embodiment.

Sixth Embodiment

A sixth embodiment relates to a semiconductor device using the graphene wiring structure according to the first embodiment. The type of the semiconductor device is not particularly limited, and the semiconductor device can be adopted for a semiconductor computing device such as a large-scale integration (LSI), a NAND type flash memory semiconductor storage device, a system on chip (SoC) including these devices, or the like.

Figure 21:
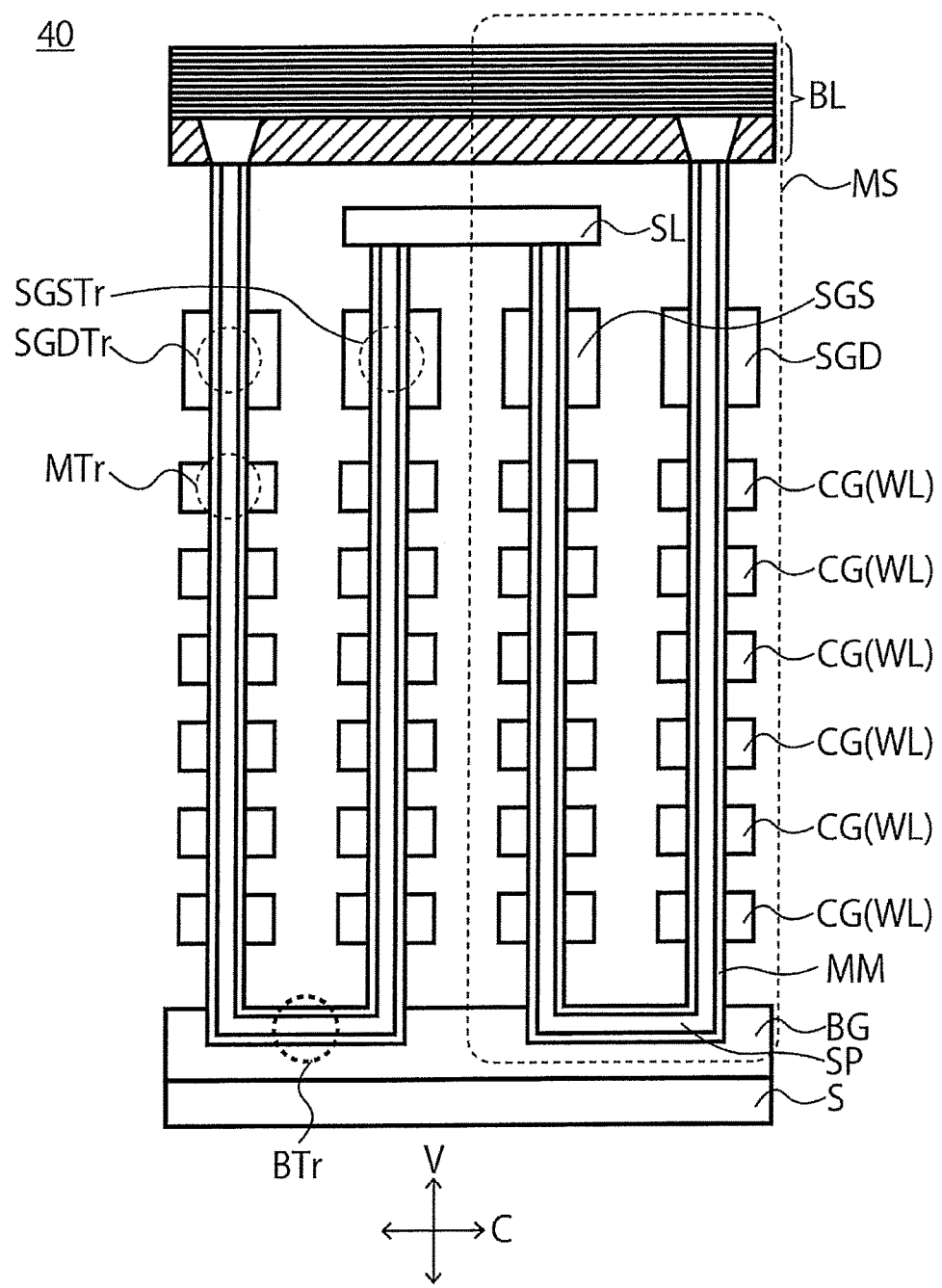
FIG. 21 is a schematic diagram of a semiconductor device according to an embodiment.

FIG. 21 illustrates a schematic cross-sectional diagram of a three-dimensional NAND type flash memory as an example of a semiconductor device (semiconductor storage device) 40 using the graphene wiring structure according to the first embodiment. The three-dimensional NAND type flash memory illustrated in FIG. 21 includes a substrate S, a back gate BG, a control gate CG (word line WL), a source side selection gate SGS (selection gate SG), a drain side selection gate SGD (selection gate SG), a source line SL, a silicon pillar SP, a memory film MM, and a bit line BL. In FIG. 21, six layers of control gates CG are laminated in a lamination direction V, but the present disclosure is not limited to this example. In FIG. 21, a memory cell array is disposed on the substrate S.

In the semiconductor device 40 according to the sixth embodiment, the graphene wiring structure according to the first embodiment is adopted as the bit line BL. A multilayer graphene of the graphene wiring structure is electrically connected to the memory film MM. Therefore, the bit line BL becomes low resistance wiring, and contributes to an improvement in signal reading speed. In the sixth embodiment, the wiring structure according to the fourth embodiment can also be adopted as the bit line BL.

A pillar extending from the bit line BL to the back gate BG is arranged in a column direction C and a row direction R perpendicular to a cross section of FIG. 11. The pillar extending from the bit line BL to the back gate BG includes the silicon pillar SP and the memory film MM surrounding an outside of the silicon pillar SP at the center. The silicon pillar SP and the memory film MM are connected to each other in the back gate BG to form a U shape.

The control gate CG and the selection gate SG extend in the row direction R, and a plurality of the control gates CG and the selection gates SG is arranged in the column direction C. In addition, the bit line BL extends in the column direction C, and a plurality of the bit lines BL is arranged in the row direction R.

The silicon pillar SP, the memory film MM around the silicon pillar SP, and various gates (control gate CG, selection gate SG, and back gate BG) constitute a memory cell transistor MTr as a memory cell, a selection gate transistor SGTr (drain side selection gate transistor SGDTr, and source side selection gate transistor SGSTr), and a back gate transistor BTr. The silicon pillar SP functions as a channel and a source/drain diffusion layer of the memory cell transistor MTr, the selection gate transistor SGTr, and the back gate transistor BTr.

Between the drain side selection gate transistor SGDTr and the source side selection gate transistor SGSTr, a plurality of current paths of the memory cell transistor MTr and the back gate transistor BTr are connected in series. A memory string MS is thereby formed.

The source line SL extends in the row direction R while connecting ends of U-shaped memory strings MS adjacent in the column direction C. The bit line BL extends in the column direction C while connecting the memory strings MS arranged in the column direction C.

A contact is connected to each of ends of the source line SL, the back gate BG, the source side selection gate SGS, and the drain side selection gate SGD in the row direction R. A contact is connected to each of stages of a plurality of the word lines WL. Each of these contacts is connected to wiring (none of these is illustrated).

In the memory cell array illustrated in FIG. 11, various transistors such as the memory cell transistor MTr are three-dimensionally arranged in a matrix shape. The memory cell array includes an assembly of these various transistors.

In the embodiment, a storage method of the memory cell may be a two-value storage method, a multi-value storage method, or the like. Data can be written or erased by controlling charge accumulation of a selected memory cell, and data can be read out from judgment of a threshold voltage changing according to the charge accumulation amount.

In the above embodiment, an example in which the memory string MS has a U-shape having a portion where the silicon pillar SP is connected to the memory film MM has been described, but the present disclosure is not limited thereto. For example, the memory string MS may have an I-shape having no connecting portion.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene wiring structure comprising:
   an amorphous or polycrystalline insulating film; and
   a multilayer graphene on the amorphous or polycrystalline insulating film, the multilayer graphene including a plurality of graphene crystals having a zigzag direction oriented at 17 degrees or less with respect to an electric conduction direction,
   wherein the zigzag direction of the plurality of graphene crystals which are oriented linearly is uniform within 17 degrees with respect to the electric conduction direction.

2. The structure according to claim 1, wherein the multilayer graphene is a laminate of a plurality of strip-shaped graphene sheets.

3. The structure according to claim 1, further comprising a cyclic structure of a five-membered ring or a seven-membered ring in the graphene crystals.

4. The structure according to claim 1, wherein the average particle diameter of the plurality of graphene crystals is larger than the width of the multilayer graphene.

5. The structure according to claim 1, wherein the electric conduction direction is a longitudinal direction of the multilayer graphene.

6. The structure according to claim 1, wherein the zigzag direction of the plurality of graphene crystals with respect to the electric conduction direction is 1 degree or more.

7. The structure according to claim 1, wherein the amorphous or polycrystalline insulating film contains at least one selected from the group consisting of $SiO_2$, $Al_2O_3$, and $TiO_2$.

8. The structure according to claim 1, further comprising a conductive portion electrically connected to the multilayer graphene in the amorphous or polycrystalline insulating film.

9. The structure according to claim 1, wherein the plurality of graphene crystals has the zigzag direction oriented at 1 degree or more and 17 degrees or less with respect to the electric conduction direction.

10. The structure according to claim 1, wherein the plurality of graphene crystals has the zigzag direction oriented at 1 degree or more and 13 degrees or less with respect to the electric conduction direction.

11. The structure according to claim 1, wherein the plurality of graphene crystals has the zigzag direction oriented at 1 degree or more and 11 degrees or less with respect to the electric conduction direction.

12. A semiconductor device using the graphene wiring structure according to claim 1.

13. The structure according to claim 1, wherein an entirely of the plurality of graphene crystals have the zigzag direction oriented at 17 degrees or less with respect to the electric conduction direction.

14. A graphene wiring structure comprising:
    an amorphous or polycrystalline insulating film; and
    a multilayer graphene on the amorphous or polycrystalline insulating film, the multilayer graphene including a plurality of graphene crystals,
    wherein an entirely of the plurality of graphene crystals have a zigzag direction oriented at 17 degrees or less with respect to the electric conduction direction.

15. The structure according to claim 14, wherein the plurality of graphene crystals has the zigzag direction oriented at 1 degree or more and 17 degrees or less with respect to the electric conduction direction.

16. The structure according to claim 14, wherein the plurality of graphene crystals has the zigzag direction oriented at 1 degree or more and 13 degrees or less with respect to the electric conduction direction.

17. The structure according to claim 1, wherein a crystallinity of the plurality of the graphene crystals is not corresponding to a crystallinity of the amorphous or polycrystalline insulating film.

18. The structure according to claim 14, a crystallinity of the plurality of the graphene crystals is not corresponding to a crystallinity of the amorphous or polycrystalline insulating film.

19. The structure according to claim 1, the multilayer graphene is directly on the amorphous or polycrystalline insulating film.

20. The structure according to claim 14, the multilayer graphene is directly on the amorphous or polycrystalline insulating film.

* * * * *